United States Patent [19]
Stokes et al.

[11] Patent Number: 5,446,306
[45] Date of Patent: Aug. 29, 1995

[54] THIN FILM VOLTAGE-TUNED SEMICONDUCTOR BULK ACOUSTIC RESONATOR (SBAR)

[75] Inventors: Robert B. Stokes, Rancho Palos Verdes; Jay D. Crawford, Long Beach; Drew Cushman, Lomita; Alvin M. W. Kong, Los Angeles, all of Calif.

[73] Assignee: TRW Inc., Redondo Beach, Calif.

[21] Appl. No.: 166,338

[22] Filed: Dec. 13, 1993

[51] Int. Cl.⁶ .................... H01L 29/82; H01L 41/04; H01L 41/08; H01L 41/18
[52] U.S. Cl. .................... 257/416; 310/320; 310/321; 310/324
[58] Field of Search ............... 257/416; 310/311, 320, 310/321, 365, 324

[56] References Cited
U.S. PATENT DOCUMENTS 5,233,259  8/1993  Kishnaswamy et al. ............ 310/324

OTHER PUBLICATIONS

Stokes, R. B. and Crawford J. D., *X-Band Thin Film Acoustic Filters on GaAs*, IEEE MTT Symposium, May 1992, TRW Electonic Systems Group, One Space Park, Redondo Beach, Calif. 90278.
Kline, G. R., Ketcham, R. S. and Lakin, K. M., *Thin Film Microwave Acoustic Filters on GaAs*, GaAs IC Symposium, IEEE 1988, pp. 313–316.
Hruska, Carl K., *The Electroelastic Tensor and Other Second-Order Phenomena in Quasilinear Interpretation of the Polarizing Effect with Thickness Vibrations of α--Quartz Plates*, Processing of the 31st Annual Symposium on Frequency Control, Jun. 1-3, 1977, pp. 159–170.

*Primary Examiner*—Steven H. Loke

[57] ABSTRACT

Disclosed is a thin film voltage-tuned semiconductor bulk acoustic resonator (SBAR). A piezoelectric film is positioned between a first electrode and a second electrode and positioned adjacent a semiconductor substrate containing a via hole. A variable voltage source applies a DC bias voltage to the electrodes which causes an electric field to be created between the electrodes within the piezoelectric film. The resulting electric field causes the piezoelectric film to resonate at a frequency different than its unbiased resonant frequency. By adjusting the variable voltage source to change the DC bias voltage, the resonant frequency from the thin film semiconductor bulk acoustic resonator (SBAR) can be varied.

22 Claims, 2 Drawing Sheets

THIN FILM VOLTAGE-TUNED SEMICONDUCTOR BULK ACOUSTIC RESONATOR (SBAR)

BACKGROUND OF THE INVENTION

1. Field of the Invention

This invention relates generally to a semiconductor bulk acoustic resonator (SBAR) and, more particularly, to a thin film voltage-tuned semiconductor bulk acoustic resonator.

2. Discussion of the Related Art

In many electrical applications, it is desirable to utilize high frequency (i.e., greater than 1 GHz) voltage-controlled oscillators (VCOs). As is well understood, high frequency voltage-controlled oscillators typically have a poorer phase noise ratio than single-frequency oscillators which are stabilized by acoustic resonators. This is because the voltage-controlled oscillators contain high 1/f noise components, such as varactors, which help determine the output frequency. To eliminate the noise problems inherent in varactors, the varactors can be combined with high-Q (quality factor) acoustic resonators to create narrowband VCOs with relatively low phase noise. However, the tuning range of these VCOs are typically only a few hundred parts per million (ppm) and the frequency control linearity is not good.

In order to eliminate this phase noise problem and the narrow tuning range, it is possible to vary the frequency of crystal-controlled oscillators by applying and varying a voltage potential between the oscillator's electrodes. This results in creating a VCO that has phase noise ratios as low as an equivalent single-frequency oscillator with highly linear control characteristics. Unfortunately, this type of VCO is not practical because an extremely high voltage is required to vary the frequency. For example, a quartz crystal resonator having a thickness of one millimeter requires 1,000 volts to produce an electric field of one million volts per meter (V/m). As such, this technique is not practical, nor utilized for crystal-controlled oscillators since an unreasonably high voltage is required to make any useful frequency change.

Each of the above-mentioned techniques produces voltage-controlled oscillators having low phase noise and relatively linear characteristics. However, each of these techniques have several drawbacks associated with their use that effect their practicality, cost, size, complexity and power consumption. What is needed then is a voltage-tuned acoustic resonator that has low phase noise, highly linear characteristics and can be varied over a broad frequency range by utilizing practical DC bias voltages. This will, in turn, reduce the cost, size, complexity and power consumption of voltage-controlled oscillators as well as tunable filters. It is, therefore, an object of the present invention to provide such a device.

SUMMARY OF THE INVENTION

In accordance with the teachings of the present invention, a thin film voltage-tuned semiconductor bulk acoustic resonator (SBAR) is disclosed as a variable frequency resonator having relatively low phase noise with highly linear characteristics. This is basically achieved by utilizing a thin (about 1 micrometer) piezoelectric film positioned between a first electrode and a second electrode and placed atop a semiconductor substrate having a via hole passing therethrough. A DC bias voltage is then applied to the first and second electrodes to create a strong electric field between the first electrode and the second electrode within the thin piezoelectric film. This allows the electric field to be varied substantially by adjusting the DC bias voltage over moderate levels which, in turn, varies the resonant frequency of the resonating piezoelectric film.

In one preferred embodiment, a semiconductor substrate having a via hole passing through the semiconductor substrate is provided. A piezoelectric film is positioned between a first electrode and a second electrode positioned adjacent to the semiconductor substrate and passing over the via hole. A DC bias voltage is then applied from the first electrode to the second electrode to create an electric field between the electrodes within the piezoelectric film. This electric field causes the piezoelectric film to resonate at a frequency slightly different than its unbiased resonant frequency. By adjusting the DC bias voltage, the electric field varies which causes the resonant frequency to be similarly adjusted.

Use of the present invention results in producing a thin film voltage-tuned semiconductor bulk acoustic resonator (SBAR) having low phase noise and highly linear characteristics. As a result, the aforementioned problems associated with the current approaches of making low phase noise and highly linear VCOs have been substantially eliminated.

BRIEF DESCRIPTION OF THE DRAWINGS

Still other advantages of the present invention will become apparent to those skilled in the art after reading the following specification and by reference to the drawings in which.

DETAILED DESCRIPTION OF THE PREFERRED EMBODIMENT

The following description of a thin film voltage-tuned semiconductor bulk acoustic resonator (SBAR) is merely exemplary in nature and is in no way intended to limit the invention or its application or uses.

Figure 1:
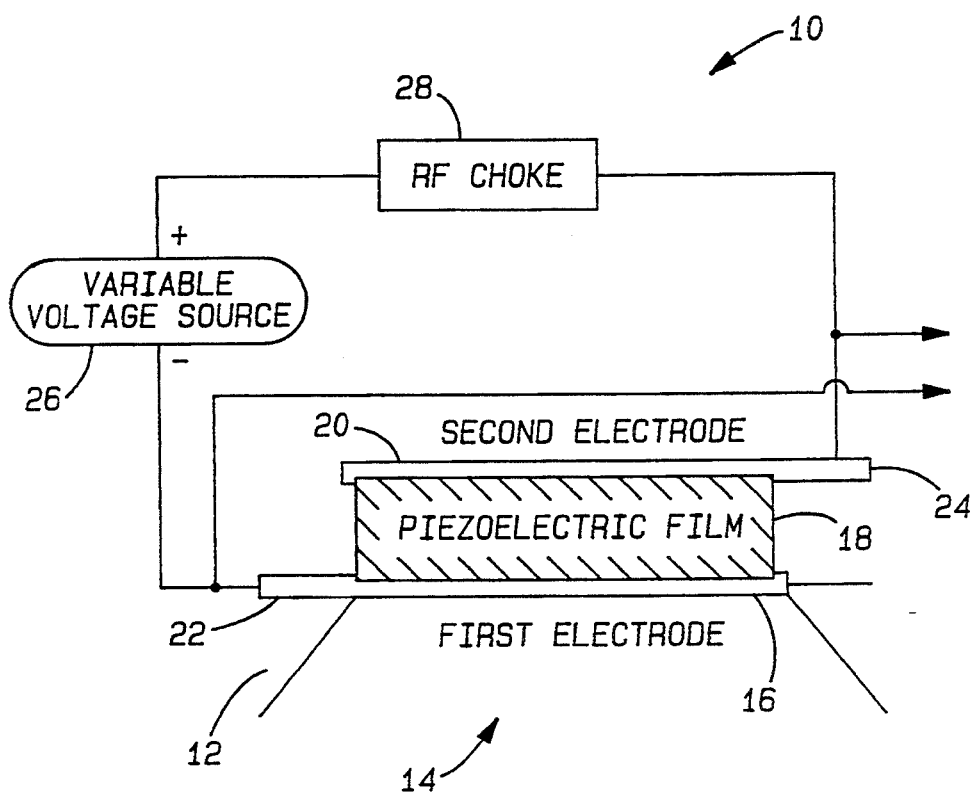
FIG. 1 is a schematic block diagram of one preferred embodiment of the present invention.

Referring to FIG. 1, a schematic block diagram of one preferred embodiment of a thin film voltage-tuned semiconductor bulk acoustic resonator (SBAR) 10, is shown. A more detailed description of a typical SBAR 10 is set forth in R. B. Stokes and J. D. Crawford, "X-Band Thin Film Acoustic Filters on GaAs," IEEE MTT Symposium 1992, herein incorporated by reference. The SBAR 10 includes a semiconductor substrate 12 having a via hole 14 extending therethrough. The semiconductor substrate 12 is preferably four mils thick and made of gallium arsenide (GaAs), however, other semiconductor materials, such as silicon, can also be used. A first electrode 16 having a thickness of between about 800 to 2,000 angstroms and preferably made of aluminum (Al), is positioned atop or adjacent to the semiconductor substrate 12 and the via hole 14. A thin piezoelectric film 18 having a thickness of between 4,000 angstroms to 10 micrometers is positioned adjacent the first electrode 16, over the via hole 14. This allows the piezoelectric film 18 to resonate or vibrate freely. The piezoelectric film 18 is preferably made of aluminum nitride (AlN). However, the piezoelectric film 18 can also consist of other suitable piezoelectric materials, such as zinc oxide. A second electrode 20, also having a thickness of between about 800 to 2,000 angstroms and preferably made of aluminum (Al), is placed adjacent the piezoelectric film 18 to create a parallel plate structure between the first electrode 16 and the second electrode 20 which comprises the active region of the SBAR 10.

A first electrical connector 22 is attached to the first electrode 16 and a second electrical connector 24 is attached to the second electrode 20. A variable voltage source 26 is connected to the first and the second electrical connectors 22 and 24 through an RF choke 28. The variable voltage source 26 is capable of applying a variable DC bias voltage, preferably between −30 volts and +30 volts, through the first and second electrical connectors 22 and 24 to the first electrode 16 and the second electrode 20. In addition, since the SBAR 10 is an insulator, essentially no power is consumed from the variable voltage source 26.

In operation, the DC bias voltage applied by the variable voltage source 26 creates an electric field (V/m) between the first electrode 16 and the second electrode 20 within the piezoelectric film 18. The electric field is equal to the bias voltage divided by the thickness of the piezoelectric film 18 or the distance between the first electrode 16 and the second electrode 20. The electric field causes the piezoelectric film 18 which is supported by its edge around the via hole 14 to have a mechanical resonance at a particular frequency, which is different than the resonant frequency without the bias. As a result, by adjusting the variable voltage source 26 to vary the DC bias voltage, the electric field between the first electrode 16 and the second electrode 20 will vary and cause the piezoelectric film 18 to resonate at different frequencies.

Figure 2:
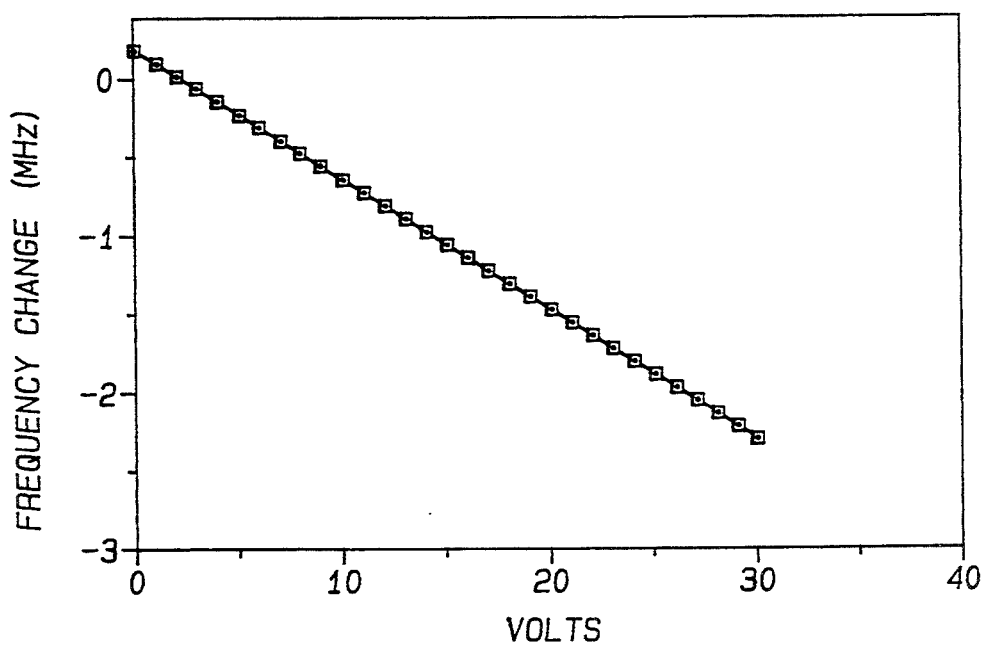
FIG. 2 is a graph showing the frequency change versus voltage for one preferred embodiment of the present invention.

For example, assume the SBAR 10 resonates at 4.8 GHz (fundamental) when a DC bias voltage is applied. This frequency can be changed by 1,000 parts per million (ppm) if the DC bias voltage is varied between −30 volts and +30 volts. This provides an SBAR 10 which has a highly linear frequency change versus voltage characteristic, as can clearly be seen in FIG. 2 which shows the frequency change as the DC bias voltage is varied between 0 and +30 volts. As seen in FIG. 2, as the DC bias voltage is increased to +30 volts, the frequency of the 4.8 GHz (fundamental) SBAR 10 is decreased by over 2 MHz. The SBAR 10 can also withstand up to 100 volts DC, thus giving it a tuning range of 3,000 parts per million (ppm). In addition, it should also be noted that for a piezoelectric film 18 having a thickness of one micrometer, an electric field of 1 million V/m can be achieved with a DC bias voltage of only 1 volt.

This highly linear and sensitive frequency change versus voltage characteristics of the SBAR 10 can be utilized to construct high frequency low phase noise voltage-controlled oscillators or tunable filters. In addition, this effect can also be used to correct or compensate for temperature sensitivity inherent in the SBAR 10. This can be achieved by simply applying a correction voltage corresponding to the operating temperature of the SBAR 10 from the first electrode 16 to the second electrode 20.

Figure 3:
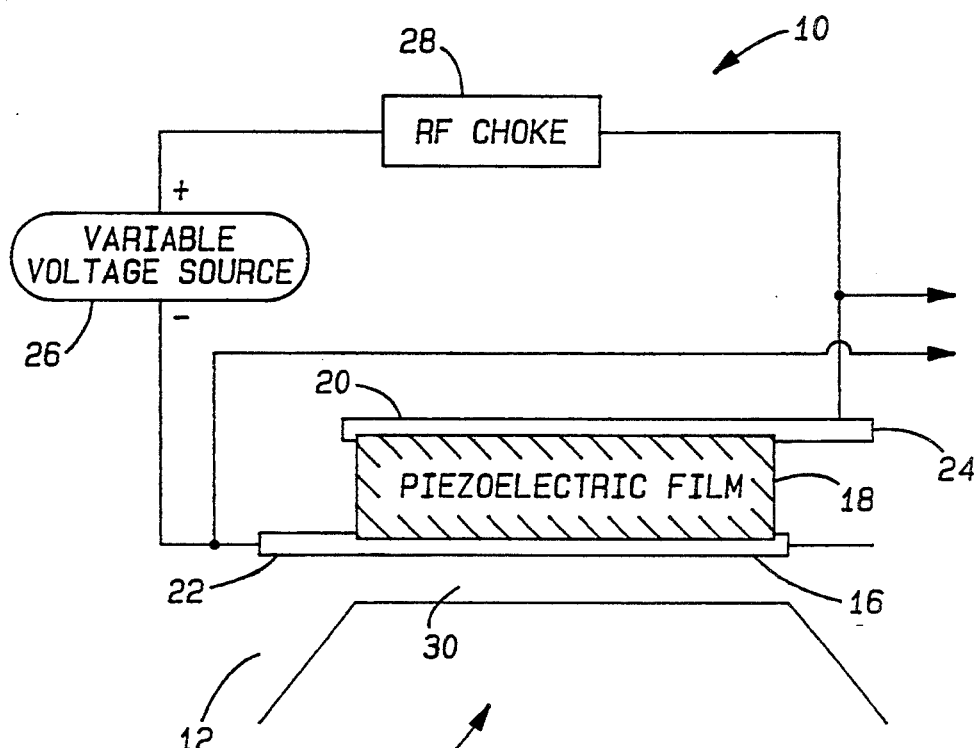
FIG. 3 is a schematic block diagram of another embodiment of the present invention.

Turning to FIG. 3, another embodiment of the SBAR 10 is shown. In this embodiment, the via hole 14 does not extend through the semiconductor substrate 12, but leaves a thinned region 30 of the semiconductor substrate 12. This thinned region 30 is preferably one micrometer in thickness and makes up the bottom layer of the SBAR 10 active region. Since the thinned region 30 is only about one micrometer in thickness, the piezoelectric film 18 is not inhibited from being able to resonate or vibrate.

Figure 4:
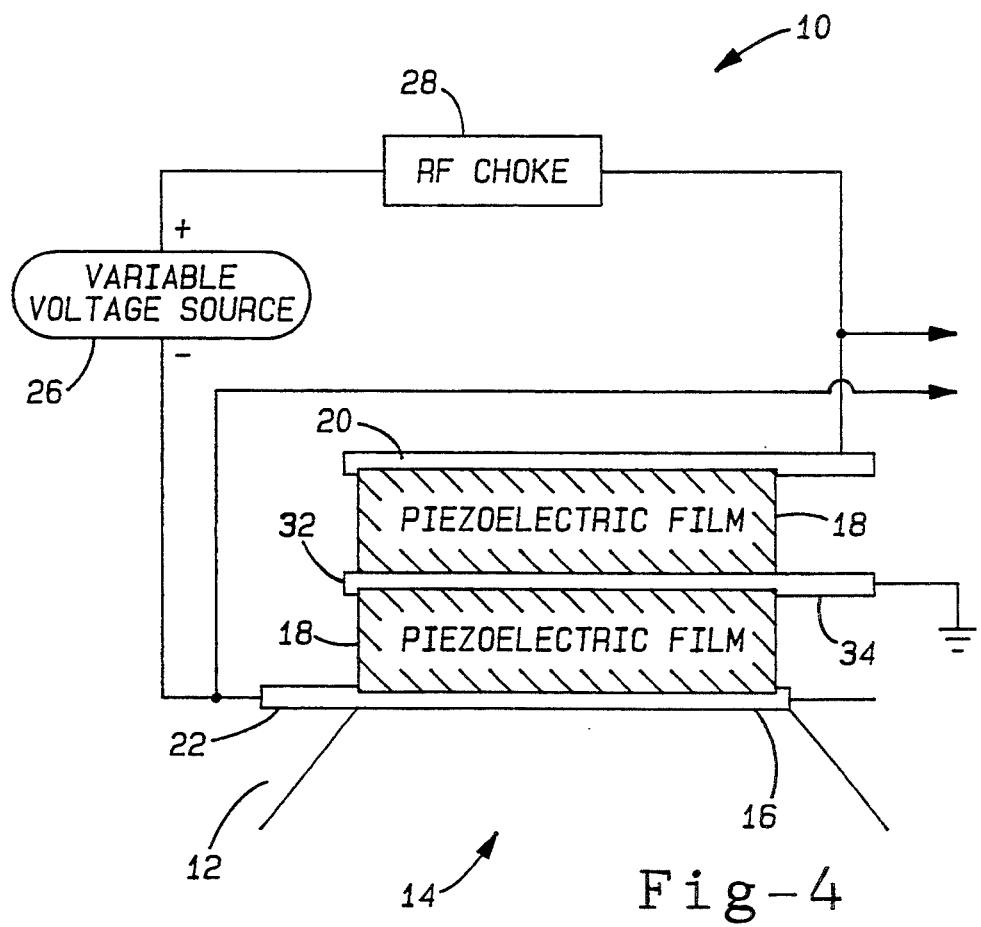
FIG. 4 is a schematic block diagram of yet another embodiment of the present invention.

Still another embodiment of the SBAR 10 is shown in FIG. 4. The SBAR 10 in FIG. 4 is a two-port resonator which can also serve as a tunable one-pole filter. This SBAR 10 comprises two piezoelectric films 18, the first electrode 16, the second electrode 20, and a third electrode 32 having a third electrical connector 34. Preferably, the third electrode 32 is grounded to help shield the first electrode 16 from the second electrode 20. To operate as a voltage tunable two port resonator or one-pole filter, the variable voltage source 26 applies the D.C. bias voltage across at least two of the electrodes, such as the first electrode 16 and the second electrode 20. It should also be noted that one skilled in the art would readily recognize that the SBAR 10 can contain additional piezoelectric layers as well as additional electrode layers to construct higher order resonators and tunable filters.

The foregoing discussion discloses and describes merely exemplary embodiments of the present invention. One skilled in the art would readily recognize from such discussion, and from the accompanying drawings and claims, that various changes, modifications and variations can be made therein without departing from the spirit and scope of the invention as defined by the following claims.

What is claimed is:

1. A thin film voltage-tuned semiconductor bulk acoustic resonator (SBAR) comprising:
   a substrate, said substrate including a via hole formed therein;
   a first electrode positioned over the via hole adjacent to the substrate;
   resonator means for resonating at a plurality of frequencies, said resonator means positioned over the via hole adjacent to the first electrode;
   a second electrode positioned adjacent the resonator means; and
   variable voltage source means for applying a DC bias voltage to the first electrode and the second electrode to create an electric field between the first electrode and the second electrode within the resonator means, said electric field causing the resonator means to resonate at a frequency other than the resonator means unbiased resonant frequency, wherein the DC bias voltage is adjustable to substantially vary the electric field to adjust the resonator means to resonate at the plurality of frequencies with highly linear characteristics.

2. The thin film voltage-tuned semiconductor bulk acoustic resonator (SBAR) as defined in claim 1, wherein the substrate comprises a semiconductor substrate.

3. The thin film voltage-tuned semiconductor bulk acoustic resonator (SBAR) as defined in claim 2, wherein the semiconductor substrate is gallium arsenide (GaAs).

4. The thin film voltage-tuned semiconductor bulk acoustic resonator (SBAR) as defined in claim 2, wherein the semiconductor substrate is silicon (Si).

5. The thin film voltage-tuned semiconductor bulk acoustic resonator (SBAR) as defined in claim 1, wherein the resonator means comprises a piezoelectric film.

6. The thin film voltage-tuned semiconductor bulk acoustic resonator (SBAR) as defined in claim 5, wherein the piezoelectric film is aluminum nitride (AlN).

7. The thin film voltage-tuned semiconductor bulk acoustic resonator (SBAR) as defined in claim 5, wherein the piezoelectric film is zinc oxide (ZnO).

8. The thin film voltage-tuned semiconductor bulk acoustic resonator (SBAR) as defined in claim 5, wherein the piezoelectric film is between 4,000 angstroms to 10 micrometers in thickness.

9. The thin film voltage-tuned semiconductor bulk acoustic resonator (SBAR) as defined in claim 1, wherein the first electrode and the second electrode are substantially comprised of aluminum (Al).

10. The thin film voltage-tuned semiconductor bulk acoustic resonator (SBAR) as defined in claim 1, wherein the via hole extends only partially through the substrate, leaving a thinned region of the substrate adjacent the first electrode.

11. The thin film voltage-tuned semiconductor bulk acoustic resonator (SBAR) as defined in claim 1, wherein the resonator means comprises a plurality of piezoelectric films separated by a plurality of electrodes.

12. The voltage-tuned semiconductor bulk acoustic resonator as defined in claim 1, wherein the variable voltage source means is operable to vary the DC bias voltage between −30 volts and +30 volts.

13. The thin film voltage-tuned semiconductor bulk acoustic resonator (SBAR) as defined in claim 1, wherein the thin film voltage-tuned semiconductor bulk acoustic resonator (SBAR) consumes substantially no power from the variable voltage source means.

14. A thin film voltage-tuned semiconductor bulk acoustic resonator (SBAR) comprising:
a semiconductor substrate having a via hole formed therein;
a first electrode positioned over the via hole adjacent to the semiconductor substrate;
at least one piezoelectric film positioned over the via hole adjacent to the first electrode;
a second electrode adjacent the piezoelectric film; and
variable voltage source means for applying a DC bias voltage to the first electrode and the second electrode to create an electric field between the first electrode and the second electrode within the piezoelectric film, said electric field operable to cause the piezoelectric film to resonate at a frequency other than the piezoelectric film resonant frequency when unbiased, wherein the DC bias voltage is adjustable between −30 volts to +30 volts to substantially vary the electric field to adjust the piezoelectric film to resonate at a plurality of frequencies having a tuning range of at least 1,000 parts per million (ppm) and highly linear characteristics.

15. The thin film voltage-tuned semiconductor bulk acoustic resonator (SBAR) as defined in claim 14, wherein the semiconductor substrate is gallium arsenide (GaAs).

16. The thin film voltage-tuned semiconductor bulk acoustic resonator (SBAR) as defined in claim 15, wherein the piezoelectric film is aluminum nitride (AlN) which is between 4,000 angstroms to 10 micrometers in thickness.

17. The thin film voltage-tuned semiconductor bulk acoustic resonator (SBAR) as defined in claim 16, wherein the first electrode and the second electrode are substantially comprised of aluminum (Al).

18. The thin film voltage-tuned semiconductor bulk acoustic resonator (SBAR) as defined in claim 14, wherein the via hole extends only partially through the substrate, leaving a thinned region of the substrate adjacent the first electrode.

19. The thin film voltage-tuned semiconductor bulk acoustic resonator (SBAR) as defined in claim 14, wherein the at least one piezoelectric film comprises a plurality of piezoelectric films separated by a plurality of electrodes.

20. A method of creating a plurality of voltage-tuned resonant frequencies, said method comprising the steps of:
providing a semiconductor substrate having a via hole formed in the semiconductor substrate;
positioning a first electrode over the via hole adjacent to the semiconductor substrate;
positioning a piezoelectric film over the via hole adjacent to the first electrode;
positioning a second electrode adjacent the piezoelectric film;
applying a DC bias voltage to the first electrode and the second electrode to generate an electric field between the first electrode and the second electrode within the piezoelectric film, wherein said electric field is operable to cause the piezoelectric film to resonate at a frequency other than the piezoelectric film unbiased resonate frequency; and
varying the DC bias voltage to substantially vary the electric field thereby adjusting the piezoelectric film to resonate at a plurality of frequencies with highly linear characteristics.

21. The method as defined in claim 20, wherein the step of providing a semiconductor substrate includes the step of providing a gallium arsenide (GaAs) semiconductor substrate.

22. The method as defined in claim 20, wherein the step of positioning the piezoelectric film includes the step of positioning an aluminum nitride (AlN) piezoelectric film being between 4,000 angstroms to 10 micrometers in thickness.

* * * * *